United States Patent
Lin et al.

(10) Patent No.: US 8,035,191 B2
(45) Date of Patent: Oct. 11, 2011

(54) CONTACT EFUSE STRUCTURE

(75) Inventors: Yung-Chang Lin, Tai-Chung Hsien (TW); Kuei-Sheng Wu, Tainan County (TW); San-Fu Lin, Pingtung County (TW); Hui-Shen Shih, Chang-Hua Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 225 days.

(21) Appl. No.: 12/326,106

(22) Filed: Dec. 2, 2008

(65) Prior Publication Data

US 2010/0133649 A1    Jun. 3, 2010

(51) Int. Cl.
*H01L 29/00* (2006.01)

(52) U.S. Cl. ......... 257/529; 257/E21.476; 257/E29.166; 438/281; 438/289

(58) Field of Classification Search .................. 257/529, 257/E29.166, E21.476; 438/281, 289, 294, 438/601
See application file for complete search history.

(56) References Cited

U.S. PATENT DOCUMENTS

| | | | |
|---|---|---|---|
| 6,433,404 B1 | 8/2002 | Iyer et al. | |
| 7,242,072 B2* | 7/2007 | Kothandaraman et al. | 257/529 |
| 7,368,801 B2* | 5/2008 | Otsuka et al. | 257/529 |
| 7,382,036 B2* | 6/2008 | Nowak et al. | 257/529 |
| 7,479,689 B2* | 1/2009 | Kim et al. | 257/529 |
| 7,674,691 B2* | 3/2010 | Cestero et al. | 438/467 |
| 2004/0004268 A1 | 1/2004 | Brown et al. | |
| 2005/0247995 A1* | 11/2005 | Pitts et al. | 257/529 |
| 2006/0081959 A1 | 4/2006 | Dondero et al. | |
| 2007/0114635 A1* | 5/2007 | Cho et al. | 257/529 |
| 2008/0067629 A1 | 3/2008 | Miyashita | |

OTHER PUBLICATIONS

Shine. Chung, Jiann-Tseng Huang, Paul Chen, Fu-Lung Hsueh, "A 512x8 Electrical Fuse Memory with 15μm2 Cells Using 8-sq Asymmetric Fuse and Core Devices in 90nm CMOS" 2007 Symposium on VLSI Circuits Digest of Technical Papers, Jun. 14, 2007, pp. 74-75, Kyoto, Japan.

* cited by examiner

*Primary Examiner* — Phuc Dang
(74) *Attorney, Agent, or Firm* — Winston Hsu; Scott Margo

(57) ABSTRACT

A contact efuse structure includes a silicon layer and a contact contacting the silicon layer with one end. When a voltage is applied to the contact, a void is formed at the end of the contact, and thus the contact is open. Such structure may be utilized in an efuse device or a read only memory. A method of making a contact efuse device and a method of making a read only memory are also disclosed.

14 Claims, 7 Drawing Sheets

CONTACT EFUSE STRUCTURE

BACKGROUND OF THE INVENTION

1. Field of the Invention

The present invention relates to an efuse structure, and particularly to a contact efuse structure used for semiconductor devices and methods of making a contact efuse device and making a read only memory (ROM).

2. Description of the Prior Art

As semiconductor processes become smaller and more complex, semiconductor components are influenced by impurities more easily. If a single metal link, a diode, or a MOS is broken down, the whole chip will be unusable. To treat this problem, fuses can be selectively blown for increasing the yield of IC manufacturing.

In general, fused circuits are redundant circuits of an IC. When defects are found in the circuit, fuses can be selectively blown for repairing or replacing defective circuits. Besides, fuses provide the function of programming circuits for various customized functions. Fuses are classified into two categories based on their operation: thermal fuse and efuse. Thermal fuses can be cut by lasers and be linked by laser repair. An efuse utilizes electro-migration for both forming open circuits and for repairing.

Opening for a poly efuse when it is blown happens at a polysilicon layer thereof. A blowing mechanism of efuse is typically shown in FIG. 1. The cathode of an efuse structure 1 is electrically connected to the drain of the transistor as a blowing device 2 (or referred to be as a driver). Voltages Vfs, Vg, and Vd are applied to the anode of the efuse structure 1, the gate of the transistor, and the drain of the transistor, respectively. The source of the transistor is grounded. The electric current is from the anode of the efuse structure 1 to the cathode of the efuse structure 1; and the electrons flow from the cathode of the efuse structure 1 to the anode of the efuse structure 1. The electric current suitable for the blowing is in a proper range. If the electric current is too low, the electron-migration is not completed, and if it is too high, the efuse tends to be thermally ruptured. In general, the blowing current for an efuse structure made by a 65 nm manufacturing process is about 13 mA.

FIGS. 2 and 3 illustrate a conventional poly efuse structure. The poly efuse structure 10 has a neck portion and includes an anode 12, a cathode 14, and a fuse body 16. A plurality of tungsten contacts 18 are disposed on the anode 12, and a plurality of tungsten contacts 20 are disposed on the cathode 14. As shown in FIG. 3, the anode 12, the cathode 14, and the fuse body 16 include a polysilicon layer 22 and a metal silicide layer 24 on the polysilicon layer 22. The metal silicide 24 assists a better electrical contact between the tungsten contacts and the electrodes. A sufficient electron flow must be supplied to the cathode 14 through the plurality of the tungsten contacts 18 disposed on the cathode 14 and flow into the polysilicon layer 22 and the metal silicide layer 24 of the neck-shaped fuse body 16 to cause electrode-migration, and thereby the fuse body 16 is blown to open. The size of the cathode is relatively large because it needs to provide an enough place for the plurality of the tungsten contacts to land thereon to totally provide a large electron flow. In turn, it needs a large blowing device (i.e. a MOS transistor) to provide the adequate electron flow since a large electron flow is required to blow the fuse body. Accordingly, it is difficult for a conventional poly efuse with such a big size to be utilized in a 32 nm semiconductor node. Moreover, in a 32 nm manufacturing process, the conventional poly gate would be replaced by a metal gate. As a result, the manufacturing process of the conventional poly efuse would not be conveniently integrated with the 32 nm manufacturing process.

Therefore, there is still a need for a novel efuse structure having a relatively small size, which may be further conveniently made from metal gate material.

SUMMARY OF THE INVENTION

One object of the present invention is to provide a contact efuse structure which may be utilized in an efuse device or a ROM structure. When it is utilized in an efuse device, only one contact is disposed on the cathode, and electric current needed for blowing the efuse can be relatively low; accordingly, the total size including the contact efuse structure and the blowing device can be reduced much. Furthermore, the contact efuse structure according to the present invention can be conveniently made using materials the same as the metal gate and made simultaneously with the metal gate. When it is utilized in a ROM structure, the structure is simple, the process is easy, and the coding is convenient.

The contact efuse structure according to the present invention includes a silicon layer; and a contact comprising a first end and a second end. The contact contacts the silicon layer with the first end. After the contact is applied with a voltage, a void is formed at the first end of the contact to allow the contact to be open.

In other aspect of the present invention, the method of making a contact efuse device includes steps of providing a substrate comprising a metal-oxide-semiconductor (MOS) transistor region and an efuse region; forming a first isolation structure in the substrate in the MOS transistor region and a second isolation structure in the substrate in the efuse region; forming a gate on the substrate in the MOS transistor region; forming an anode, a cathode, and a fuse link connecting the anode and the cathode on the second isolation structure in the efuse region; forming a source and a drain in the substrate at two sides of the gate, respectively; depositing a dielectric layer to cover the entire substrate; and forming at least a first contact to contact the anode, an only second contact to contact the cathode, and a third contact to contact the drain through the dielectric layer, respectively.

In still other aspect of the present invention, the method of making a read only memory array structure according to the present invention includes providing a semiconductor substrate; forming a plurality of gate structures on the semiconductor substrate; performing a doping process to form a doping region in the semiconductor substrate at a side of each of the gate structures; forming a contact on each of the doping regions or the gate structures; and applying a voltage to at least one of the contacts to form a void to allow the at least one of the contacts to be open.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
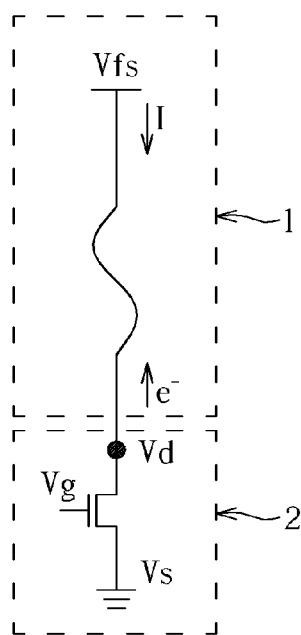
FIG. 1 illustrates a blowing mechanism of an efuse device.
Figure 2:
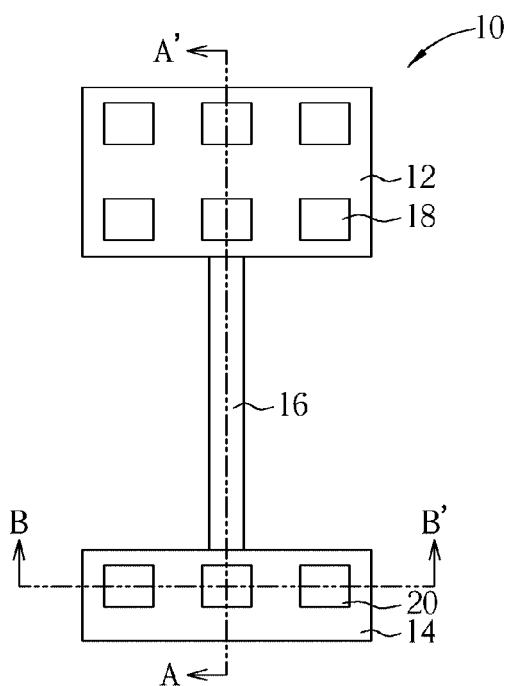
FIG. 2 illustrates a schematic top view of a conventional poly efuse structure.
Figure 3:
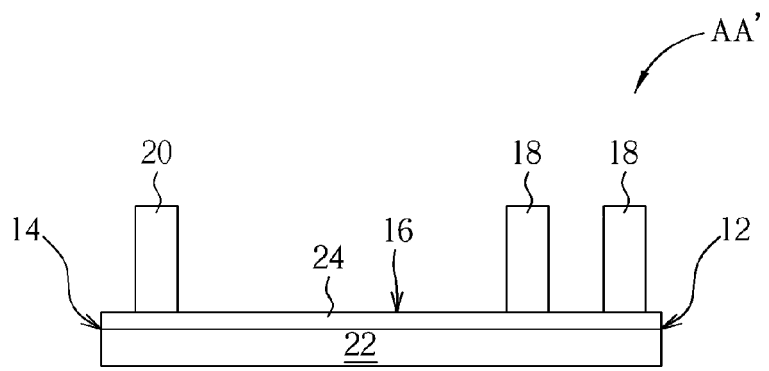
FIG. 3 illustrates a schematic cross-section view of the poly efuse structure taken along the line AA' as shown in FIG. 2.
Figure 4:
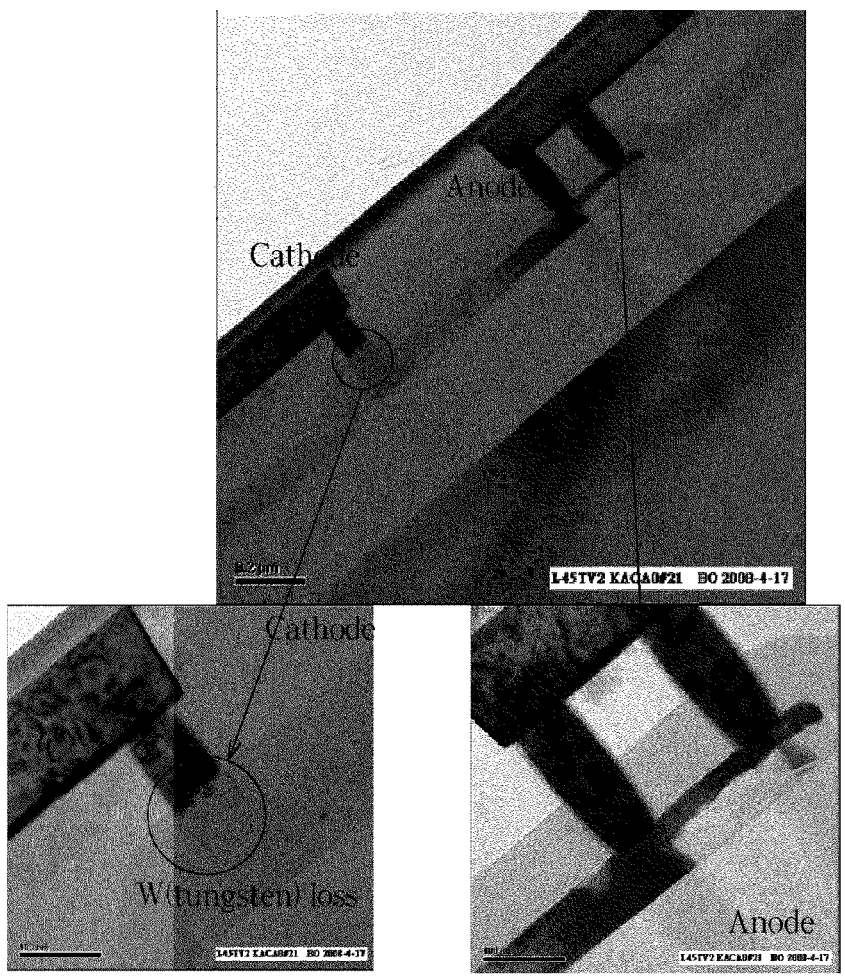
FIG. 4 is a transmission electron microscopic photograph of a cross-section of a poly efuse structure taken along the line AA' as shown in FIG. 2.
Figure 5:
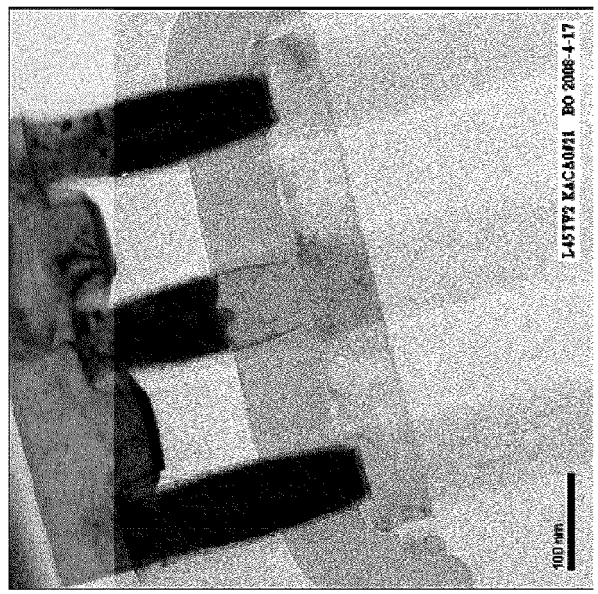
FIG. 5 is a transmission electron microscopic photograph of a cross-section of a poly efuse structure taken along the line BB' as shown in FIG. 2.

FIG. 4 is a transmission electron microscopic photograph of a cross-section of a conventional poly efuse structure 10 taken along the line AA' as shown in FIG. 2. The inventors of the present invention found that an empty place would present in the metal silicide layer due to the sweeping of the metal silicide from the cathode to the anode caused by the electric current from the cathode to the anode during the blowing of the poly efuse. The inventors further found that the tungsten contacts connecting the cathode would be also swept after the metal silicide layer was swept, leading to a tungsten loss. The resistance ($R_S$ value) of the efuse would be from low to high during the blowing. Further referring to FIG. 5, a transmission electron microscopic photograph shows a cross-section of the conventional poly efuse structure 10 taken along the line BB' as shown in FIG. 2. In view of FIG. 5, the inventors further found that only the middle one of the three tungsten contacts disposed on the cathode would encounter the tungsten loss. Based on these phenomena, the inventors present a novel contact efuse structure, a method of making a contact efuse device, and a method of making a ROM array structure, which are described respectively in detail hereinafter.

Figure 6:
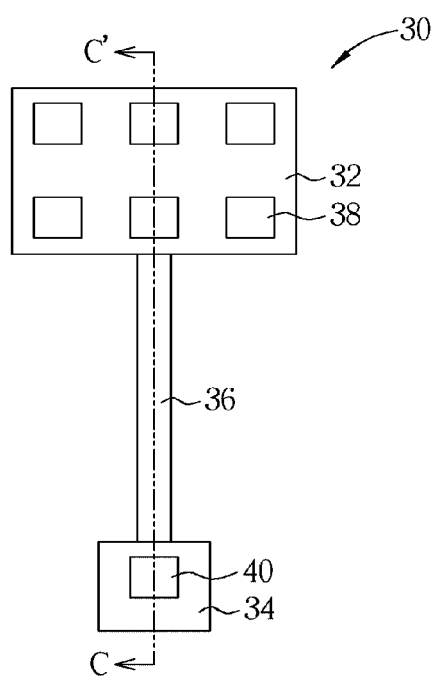
FIG. 6 illustrates a schematic top view of an embodiment of a utilization of the contact efuse structure according to the present invention in an efuse device.

Referring to FIG. 6, the contact efuse device 30 includes an anode 32, a cathode 34, and a fuse link 36. The fuse link 36 connects the anode 32 and the cathode 34. At least a contact 38 is disposed to connect the anode 32. The number of the contacts is not particularly limited. The contacts are more, the resistance is lower. The contacts also serve for a function of heat conduction or heat dissipation to avoid over-temperature of the anode. There are six contacts 38 on the anode 32 as shown in FIG. 6. Nevertheless, there is only one contact 40 connecting the cathode 34, and accordingly the electron flow coming from the drain of the transistor of the blowing device may be concentrated to go into the contact 40, leading to an efficient blowing. In turn, the electron flow required is relatively not high, and accordingly, the size of the blowing device required is not big and may be much smaller than that of a conventional one. The shape of the contact efuse device 30 is not particularly limited. It may have a neck portion, but not limited thereto. The size of the cathode 34 may be just a little larger than that of the bottom area of the contact 40. The size of the contact may depend on the design as desired and process limitation. The shape of the contact is not particularly limited to cylinder or column and may be frustum. The size of the anode is not particularly limited, as long as it can sufficiently provide the landing area for the contacts thereon.

The materials for the anode 32, the cathode 34, and the fuse link 36 may each independently include conductive material, such as polysilicon, metal, or a combination of both, i.e. they may be same or different from each other. However, it is convenient for them to be gate material, and the gate and the fuse may be made simultaneously in a MOS manufacturing process. For example, when the gate material is polysilicon, the anode 32, the cathode 34, and the fuse link 36 are also made of polysilicon and patterned simultaneously into integrity. Metal, such as Ta, TaN, Ti, TiN, Al, Cu, and the like, or a composite of a polysilicon layer and a metal layer stacked up and down, is also useful in the present invention. The material for contacts may be conductive material, such as tungsten metal, Ta, TaN, Ti, TiN, Al, Cu, and the like, for making the contacts of the efuse by the semiconductor device manufacturing process.

Figure 7:
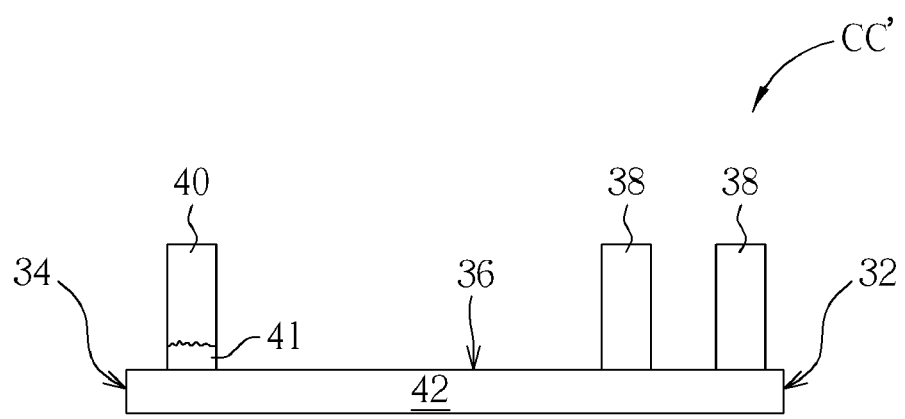
FIG. 7 illustrates a schematic cross-section view taken along the line CC' as shown in FIG. 6.

FIG. 7 illustrates a schematic cross-section view of the contact efuse device 30 taken along the line CC' as shown in FIG. 6. In this embodiment, the anode 32, the cathode 34, and the fuse link 36 are formed together to form an efuse pattern layer 42, and the opening after the blowing is located at the contact 40. As shown in the drawing, the opening of the contact 40 forms a void 41.

Figure 8:
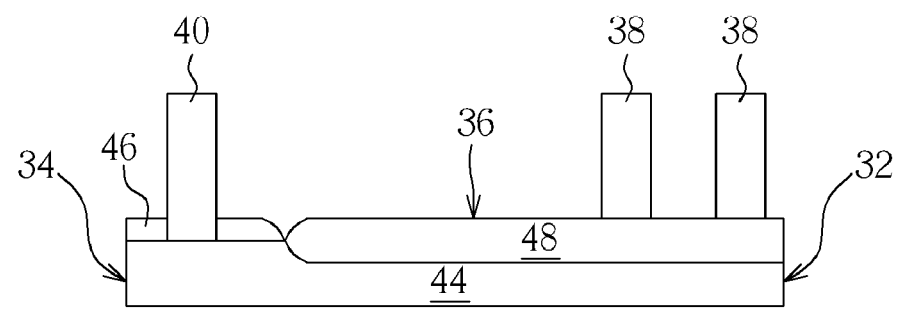
FIG. 8 illustrates a schematic top view of another embodiment of a utilization of the contact efuse structure according to the present invention in an efuse device.

In the present invention, when the surface of the anode, the cathode, and the fuse link is polysilicon, i.e. as shown in FIG. 8, when the efuse pattern layer including the anode 32, the cathode 34, and the fuse link 36 is formed of polysilicon or the surface thereof is a polysilicon layer 44, a salicide block (hereinafter SAB layer) 46 may be further formed on and cover the entire surface of the cathode 34. The uncovered portion may be further formed into a metal silicide layer 48. The uncovered portion may include for example the anode 32 and the fuse link 36, the surface of a part or the entirety of which is formed into metal silicide layer. The SAB layer may be for example silicon nitride, silicon oxynitride, or other proper material. The contacts 38 on the anode 32 contact the metal silicide layer 48, and the contact 40 on the cathode 34 contacts the polysilicon layer 44 through the SAB layer 46. Thus, the polysilicon layer 44 has a relatively high resistance to produce more heat and thus the temperature is raised, thereby the opening of the contact 40 may be advantageously attained by electron migration. Additionally, the metal silicide layer 48 has a relatively low resistance to avoid a drastic voltage drop, and thus the produced heat is little to prevent from thermal cleavage of the efuse.

Figure 9:
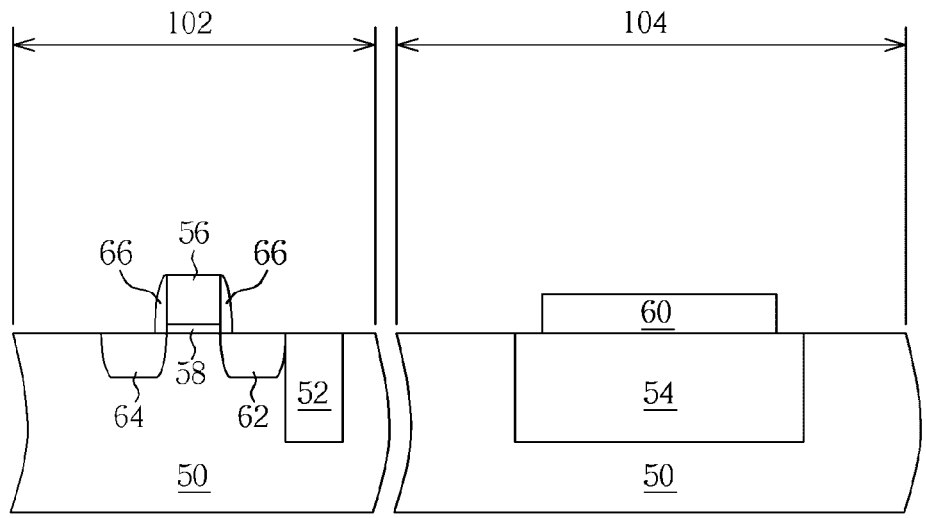
FIG. 9 and FIG. 10 illustrate schematic cross-section views of an embodiment of the method of making a contact efuse device according to the present invention.
Figure 10:
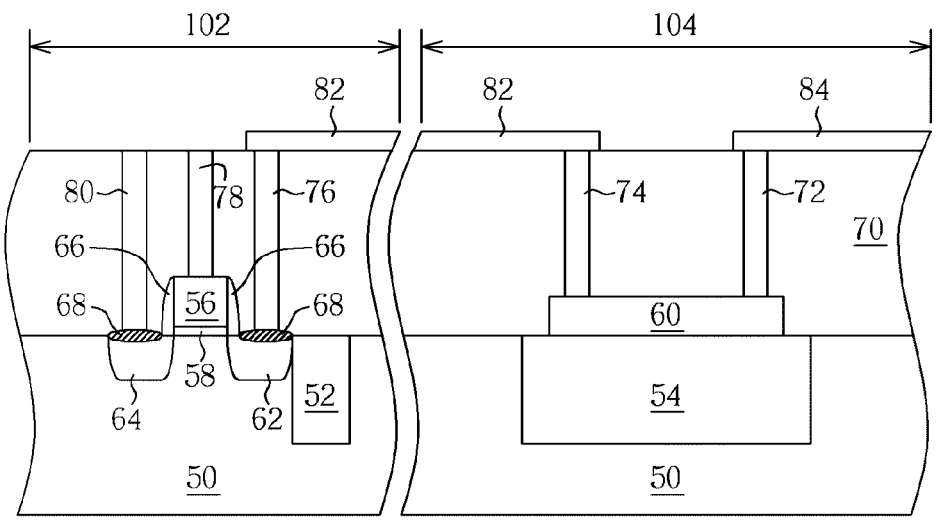

The contact efuse device may be formed on an insulation structure (for example a shallow trench) in the semiconductor substrate, the contact on the cathode of the efuse structure is electrically connected to the drain of the transistor of the blowing device through a metal interconnect and a contact on the drain. FIGS. 9 and 10 illustrate a method of making the contact efuse device according to the present invention, in which a blowing device is also formed. First, referring to FIG. 9, a substrate 50, for example, a semiconductor substrate, is provided. The substrate 50 includes a MOS transistor region 102 and an efuse region 104. Next, an isolation process is performed to form an isolation structure, such as a shallow trench isolation 52, in the substrate 50 between the MOS transistor region 102 and the efuse region 104, for isolation between the blowing device and the efuse structure. An isolation structure, such as a shallow trench isolation 54, is also formed in the substrate 50 in the efuse region 104. The shallow trench isolations 52 and 54 may be filled with for example oxide. Thereafter, a thin dielectric layer, such as an oxide layer (such as silicon oxide, aluminum oxide, hafnium oxide, lanthanum oxide, and the like), is formed all over the substrate, and a gate material layer, such as a metal layer, a polysilicon layer or a composite layer of a polysilicon layer stacking on a metal layer, but not limited thereto, is formed all over on the dielectric layer. Thereafter, a photolithography and etching process may be carried out to define a gate 56 and a gate dielectric layer 58 beneath the gate 56, which are formed on the substrate in the MOS transistor region 102. At the same time, an efuse pattern layer 60 including the anode body, the cathode body, and the fuse link body of the contact efuse device is also patterned to form on the surface of the shallow trench isolation 54 in the efuse region 104. A drain 62 and a source 64 are formed in the substrate 50 at the two sides of the gate 56 through a doping process. Thereafter, a spacer 66 may be further formed on the sidewall of the gate 56.

Thereafter, referring to FIG. 10, a salicide process may be further carried out to form a metal silicide layer 68 on the surface of the drain 62 and the source 64. Metal silicide may be for example nickel silicide or cobalt silicide, but not limited thereto. When the surface of the gate 56 and the efuse pattern layer 60 is metal, a metal silicide layer will not formed thereon. Subsequently, a dielectric layer 70 may be formed all over to cover the substrate 50 through, for example, a chemical vapor deposition. Openings are formed by etching through the dielectric layer 70 as contact vias, and a barrier layer, such as a Ti/TiN layer, may be further formed on the sidewall and the bottom of the openings. Contact material, such as tungsten metal, is filled into the contact vias through the dielectric layer 70, using for example a chemical vapor deposition process for tungsten deposition and then etch back, to form a contact 72, a contact 74, and a contact 76 to contact the metal silicide layer 68 on the anode, the cathode, and the drain, respectively. A contact 78 and a contact 80 are also formed through the dielectric layer 70 to contact the gate 56 and the metal silicide layer 68 on the source 64, respectively. Thereafter, a metal interconnect process is performed on the surface of the dielectric layer 70. For example, a metal interconnect 82 is formed to connect the contact 74 on the cathode and the contact 76 on the drain, and a metal interconnect 84 is formed to connect the contact 72 on the anode and the peripheral logic circuit.

Figure 11:
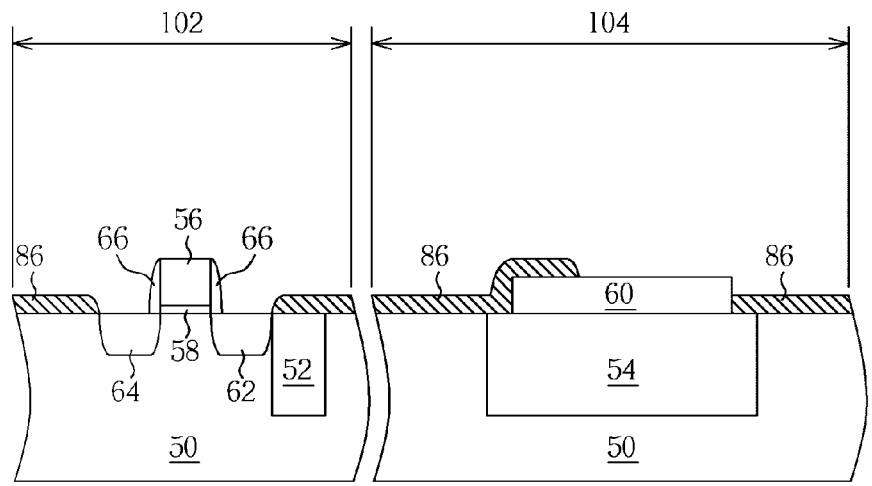
FIG. 11 and FIG. 12 illustrate schematic cross-section views of another embodiment of the method of making a contact efuse device according to the present invention.
Figure 12:
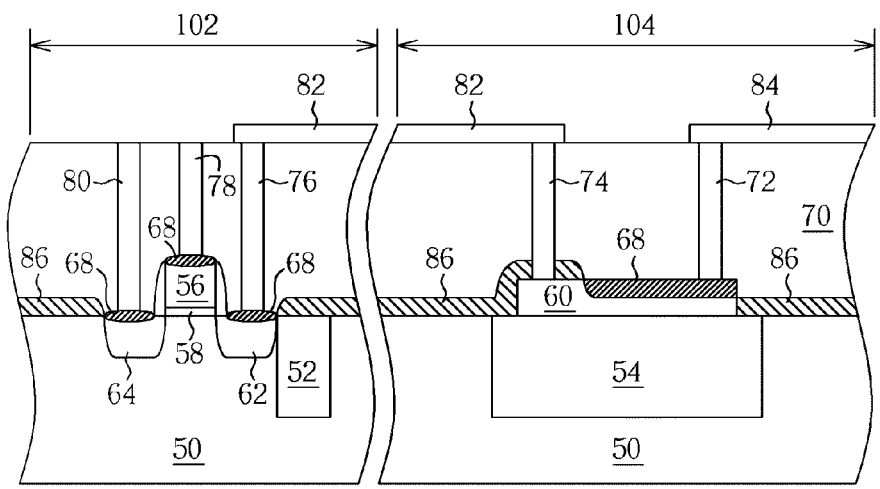

When the gate material is polysilicon or the surface of the gate is a polysilicon layer, it is considered to or not to perform a salicide process on the efuse pattern layer 60. If it is not considered to perform a salicide process on the efuse pattern layer 60, the efuse region 104 may be covered during a salicide process performed on the source, the gate, and the drain to form a metal silicide layer on the surface thereof. If it is considered to perform a salicide process on the anode body and the fuse link of the efuse pattern layer 60, the process may be referred to FIG. 11, i.e., a SAB layer may be formed all over on the substrate 50, and patterned to expose the surface of the source, the gate, and the drain in the MOS transistor region 102 and surface of the anode body and the fuse link in the efuse region 104, while the cathode body is still covered with the SAB layer 86. Thereafter, as shown in FIG. 12, a dielectric layer 70 is formed all over to cover the substrate 50. Contact vias are formed through the dielectric layer 70, and a barrier layer, such as a Ti/TiN layer, may be further formed on the sidewall and the bottom of the openings. Contact material, such as tungsten metal, is filled into the contact vias through the dielectric layer 70 to form a contact 72, a contact 74, and a contact 76 to contact the metal silicide layer 68 on the anode, the cathode, and the drain, respectively. A contact 78 and a contact 80 are also formed through the dielectric layer 70 to contact the gate 56 and the metal silicide layer 68 on the source 64, respectively. Thereafter, a metal interconnect process is performed on the surface of the dielectric layer 70. For example, a metal interconnect 82 is formed to connect the contact 74 on the cathode and the contact 76 on the drain, and a metal interconnect 84 is formed to connect the contact 72 on the anode and the peripheral logic circuit.

In comparison with conventional contact efuse device, the contact efuse device including the contact efuse structure according to the present invention include an only contact on the cathode, and accordingly the amount of electric current for the blowing is relatively small, for example, it may be reduced by 30% or more, and the size of the blowing device may be reduced. The contact efuse device may be made with gate material, and the manufacturing process is compatible with the manufacture of the metal gate or the poly gate. It further has advantages as follows: it may be in a shape as a poly efuse usually in; it may be destroyed by a high current or kept intact; its manufacturing process is compatible with a logic process without an additional mask or a process step; its scalability is flexible and compatible with future generations; it may be impaired in Package/Field level; it permits improved metal routing over, for example, allowing M5 and above; it is time saving that a total time to fuse a chip is less than that to fuse laser Fuse; and it may be widely used in redundancy repair, trimming of analog circuit, chip-ID and password strings.

As described above and shown in FIGS. 7 and 8, after a voltage (greater or equal to a threshold voltage (the threshold voltage has a minimal voltage value to open the contact efuse structure)) is applied to the upper end of the contact 40, a void forms at the lower end of the contact 40 contacting the cathode 34. The void may be formed due to electron migration of the metal (such as tungsten) of the contact 40. The electric circuit at the void is open. The contact 40 and the silicon layer (such as the cathode 34) form the contact efuse structure of the present invention. In addition to the utilization in the aforesaid efuse device, the contact efuse structure also can be utilized in a ROM structure to serve as a structure to "be burned" when the ROM is encoded.

The contact may further include a metal plug and a barrier layer surrounding the metal plug. In such structure, the contact contacts the silicon layer with the barrier layer. When the contact is open upon the application of a voltage, the atoms of both the barrier layer and the metal plug at the location of the contact interface, not the atoms of the barrier layer at the side wall of the metal plug, move out to leave a void and to result in an open circuit or a change of resistance.

Figure 13:
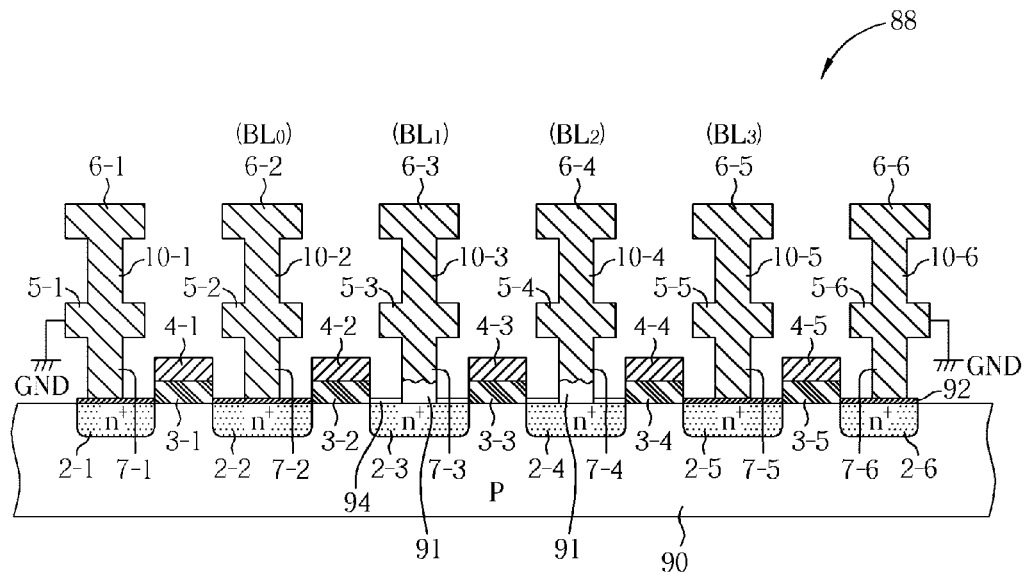
FIG. 13 illustrates a schematic cross-section views of an embodiment of an utilization of the contact efuse structure according to the present invention in a ROM.

FIG. 13 illustrates a schematic cross-section view of an embodiment of a utilization of the contact efuse structure according to the present invention. A ROM 88 is formed on a substrate 90, for example, a p-type semiconductor substrate. A plurality of n-type doping regions 2-1, 2-2, 2-3, 2-4, 2-5, 2-6 are disposed in the substrate 90. A plurality of insulating films 3-1, 3-2, 3-3, 3-4, 3-5, and a plurality of polysilicon films 4-1, 4-2, 4-3, 4-4, 4-5 on the insulating films are disposed on the substrate 90. The polysilicon films, the insulating films disposed under the polysilicon films, and the n-type doping regions formed at two sides of the above films are used to define a plurality of NMOS transistor. Each of the polysilicon film, serving as the gate of the NMOS transistor, is electrically connected to corresponding word lines, and the n-type doping regions are the sources/drains of the NMOS transistors. The read only memory 88 also includes a first metal wiring layer 5-1, 5-2, 5-3, 5-4, 5-5, 5-6 and a second metal wiring layer 6-1, 6-2, 6-3, 6-4, 6-5, 6-6. A plurality of via plugs 10-1, 10-2, 10-3, 10-4, 10-5, 10-6 are disposed between a portion of the first metal wiring layer and the second metal wiring layer, and the first wiring layer 5-1, 5-2, 5-3, 5-4, 5-5, 5-6 is electrically connected to the n-type doping regions 2-1, 2-2, 2-3, 2-4, 2-5, 2-6 through contacts 7-1, 7-2, 7-3, 7-4, 7-5, 7-6. A metal silicide layer 92 is disposed on some of the n-type doping regions (such as 2-1, 2-2, 2-5, and 2-6), and, accordingly, some of the contacts (such as 7-1, 7-2, 7-5, 7-6) contact the metal silicide layer on the doping region. Some of contacts (such as 7-3, 7-4) directly contact the doping region, which utilize the contact efuse structure of the present invention.

The second metal wiring layer 6-2, 6-3, 6-4, 6-5 preferably serves as the bit lines $BL_0$, $BL_1$, $BL_2$, $BL_3$ of the read only memory, and the intersecting region of the word lines and the bit lines is a memory cell for storing data, in which the bit lines $BL_0$, $BL_1$, $BL_2$, $BL_3$ are electrically connected to the n-type doping regions 2-2, 2-3, 2-4, 2-5 through the via plugs 10-2, 10-3, 10-4, 10-5 and contacts 7-2, 7-3, 7-4, 7-5. While the read only memory is encoded, a voltage is applied to the contacts through the bit lines. The contacts 7-3 and 7-4 are open at the portions which contact the n-type doping regions 2-3 and 2-4, and voids 91 are formed at the ends of the contacts, to open the circuit. The presence of a void or not in the contact after the voltage is applied would determine the message data stored in the memory cell to be either "0" or "1", thereby constituting the program code of the read only memory. Therefore, the contact efuse structures may be disposed in desired memory cells according to a program code.

Another aspect for the contact efuse structure of the present invention to be utilized in a ROM is to directly form a contact on each n-type doping region without the formation of metal silicide layer and SAB layer on the doping regions. When the ROM is encoded, a voltage greater than or equal to the threshold voltage is applied to the addressed contacts of the memory cells, thus the presence of a void in the contact would determine the message data stored in the memory cell to be either "0" or "1".

Figure 14:
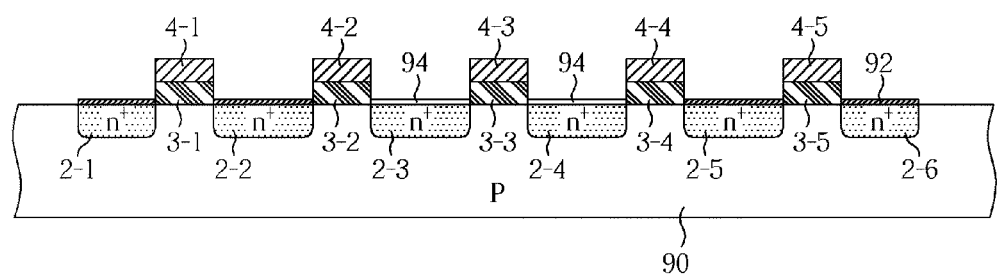
FIG. 14 illustrates a schematic cross-section view of an embodiment of the method of making a ROM array structure according to the present invention.

FIG. 14 illustrates a schematic cross-section view of an embodiment of the method of making a ROM array structure according to the present invention. First, a substrate 90 is provided. A plurality of gate structures are formed on the substrate 90. The gate structures may includes insulating films 3-1, 3-2, 3-3, 3-4, 3-5, and polysilicon films 4-1, 4-2, 4-3, 4-4, 4-5. Thereafter, a doping process is carried out to form a plurality of n-type doping regions 2-1, 2-2, 2-3, 2-4, 2-5, 2-6 in the substrate 90 at the sides of the gate structures.

Thereafter, when it is desired to form a metal silicide layer, an SAB layer 94 may be formed in advance on some of the doping regions and other doping regions are exposed. A salicide process may be performed to form a metal silicide layer 92 on the exposed doping regions. Thereafter, for example, a damascene or dual damascene process may be performed to form contacts on the doping regions. The contacts formed on the doping regions covered with the SAB layer pass through the SAB layer to contact the underlying doping regions, and the contacts formed on the doping regions covered with the metal silicide layer contact the top surface of the metal silicide layer. Then, metal wiring structures or via plug structures are formed. The embodiment of the ROM shown in FIG. 13 may be obtained.

When a ROM is encoded by addressing, it is desired not to form a metal silicide layer on the doping regions. In such situation, after the doping regions are formed, contacts can be formed directly. For example, a damascene or dual damascene process may be performed to form contacts on the doping regions to directly contact the doping regions. Then subsequent processes are performed.

Likewise, the efuse structure may be disposed on the gate structure, i.e. the contacts are disposed on the gate structure, when the upper layer of the gate structure is a polysilicon layer and this polysilicon layer may serve as the silicon layer required in the contact efuse structure. As such, there are also various modifications with respect to the contact efuse structure including the contact and the gate structure, similar to the contact efuse structure including the contact on the doping region.

Those skilled in the art will readily observe that numerous modifications and alterations of the device and method may be made while retaining the teachings of the invention.

What is claimed is:

1. A contact efuse structure, comprising:
   a silicon layer; and
   a contact comprising a first end and a second end, the contact contacting the silicon layer with the first end, wherein after the contact is applied with a voltage, a void is formed at the first end to allow the contact to be open, and the void is between the contact and the silicon layer.

2. The structure of claim 1, wherein the silicon layer comprises polysilicon material.

3. The structure of claim 1, wherein the silicon layer comprises a dopant.

4. The structure of claim 1, wherein the contact comprises tungsten, tantalum, tantalum nitride, titanium, titanium nitride, aluminum, or copper.

5. The structure of claim 1, wherein the contact comprises a metal plug and a barrier layer surrounding the metal plug.

6. The structure of claim 1 used in a contact efuse device, wherein the contact efuse device comprises:
   an anode;
   the silicon layer comprising a polysilicon layer as a cathode;
   a fuse link connecting the anode and the cathode; and
   the contact disposed on the cathode, for accepting the voltage to form the void and to be open.

7. The structure of claim 1 used in a read only memory, wherein a unit structure of the read only memory includes:
   a semiconductor substrate;
   a gate structure on the semiconductor substrate;
   the silicon layer being a doping region in the semiconductor substrate at a side of the gate structure; and
   the contact on the doping region for accepting the voltage to form the void and be open.

8. The structure of claim 1 used in a read only memory, wherein a unit structure of the read only memory includes:
   a semiconductor substrate;
   a gate structure on the semiconductor substrate, an upper portion of the gate structure comprising a polysilicon layer;
   a doping region in the semiconductor substrate at a side of the gate structure; and
   the contact on the polysilicon layer of the gate structure for accepting the voltage to form the void and be open.

9. A contact efuse structure, comprising:
   an efuse pattern layer comprising a cathode, an anode and a fuse link connecting the anode and the cathode, wherein the cathode comprises a silicon layer, and the anode comprises a metal silicide layer;
   a first contact comprising a first end and a second end, the first contact contacting the silicon layer of the cathode with the first end; and a second contact contacting the metal silicide layer of the anode.

10. The contact efuse structure of claim 9, wherein a salicide block layer is disposed on the silicon layer of the cathode.

11. The structure of claim 9, wherein the silicon layer comprises polysilicon material.

12. The structure of claim 9, wherein the silicon layer comprises a dopant.

13. The structure of claim 9, wherein the first contact and the second contact comprise tungsten, tantalum, tantalum nitride, titanium, titanium nitride, aluminum, or copper.

14. The structure of claim 9, wherein the first contact and the second contact comprise a metal plug and a barrier layer surrounding the metal plug.

* * * * *